United States Patent [19]

Hopfer, III et al.

[11] Patent Number: 4,988,306
[45] Date of Patent: Jan. 29, 1991

[54] LOW-LOSS ELECTRICAL INTERCONNECTS

[75] Inventors: Albert N. Hopfer, III, Park Ridge; Richard J. Lindeman, Wood Dale, both of Ill.

[73] Assignee: Labinal Components and Systems, Inc., Elk Grove Village, Ill.

[21] Appl. No.: 352,499

[22] Filed: May 16, 1989

[51] Int. Cl.⁵ .............................................. H01R 9/09
[52] U.S. Cl. ...................................... 439/66; 439/74; 439/247; 439/591
[58] Field of Search .................. 439/66, 74, 78, 79, 439/247, 252, 788, 817, 840, 841

[56] References Cited

U.S. PATENT DOCUMENTS

| | | | |
|---|---|---|---|
| 2,153,177 | 4/1939 | Ecker | 439/841 |
| 2,853,656 | 9/1958 | Dowds | 317/101 |
| 3,419,844 | 12/1968 | Schmued | 339/48 |
| 3,509,296 | 4/1970 | Harshman et al. | 200/46 |
| 3,513,434 | 5/1970 | Zielke | 439/840 |
| 3,680,037 | 7/1972 | Nellis et al. | 339/61 M |
| 3,764,959 | 10/1973 | Toma et al. | 339/177 R |
| 3,858,958 | 1/1975 | Davies | 339/17 LM |
| 3,862,790 | 1/1975 | Davies et al. | 339/17 LM |
| 3,881,799 | 5/1975 | Elliott et al. | 29/193.5 |
| 3,971,610 | 7/1976 | Buchoff et al. | 339/17 R |
| 4,029,375 | 6/1977 | Gabrielian | 439/66 |
| 4,082,399 | 4/1978 | Barkhuff | 439/841 |
| 4,257,661 | 3/1981 | Dalamangas et al. | 339/75 MP |
| 4,360,858 | 11/1982 | Fahling | 361/380 |
| 4,574,331 | 3/1986 | Smolley | 361/393 |
| 4,581,679 | 4/1986 | Smolley | 361/395 |
| 4,593,961 | 6/1986 | Cosmo | 339/61 M |
| 4,620,761 | 11/1986 | Smith et al. | 439/817 |
| 4,733,172 | 3/1988 | Smolley | 324/158 P |

Primary Examiner—Paula A. Bradley
Attorney, Agent, or Firm—Neuman, Williams, Anderson & Olson

[57] ABSTRACT

Apparatus and methods for facilitating insertion and maximizing resiliency, reliability and conductivity of button contacts in button board type circuit interconnectors.

51 Claims, 4 Drawing Sheets

LOW-LOSS ELECTRICAL INTERCONNECTS

FIELD OF THE INVENTION

The present invention relates to electronic circuit interconnection, and more particularly to apparatus and methods for interconnecting separable electronic circuits along defined electronic circuit interfaces.

BACKGROUND OF THE INVENTION

The use of wadded conductor contacts or "buttons" mounted in insulator substrates to form "button boards" is a known type of interface device for electronic circuit coupling. They typically provide both direct coupling and physical separation between electronic circuits, which are commonly formed on adjacent circuit boards. Most frequently, resilient bundles or "wads" of fine electric current conductors are retentively engaged in corresponding holes in or passing through the non-conductive substrate carrier board. The ends of these wads or "buttons" are exposed and typically protrude at the respective surface of the insulative carrier board; see for example U.S. Pat. Nos. 4,581,679 and 4,574,331. Such conductive wads have very low resistance to current when their exposed ends or "buttons" are compressively engaged with surface contact pad areas on the circuit boards.

Furthermore, because their ratio of diameter to length in a compressed state is considerably larger than contacts previously known in the connector art and because of their random internal multi-contact composition, such wadded conductor elements have relatively low capacitance and inductance, and so they provide relatively low impedance for dynamic electronic circuit configurations, such as are used for high speed data processing and other high bandwidth applications.

Even though such button boards are technically superior to many other electronic circuit interconnection arrangements, previously proposed designs have presented a number of practical problems in their fabrication and use. Heretofore, cylindrical button contacts of wadded fine conductor wires have been inserted axially into generally uniform cylindrical holes which were formed in the substrate such as by acid etching of ceramicized glass substrates or drilling a laminated or sheet plastic insulator sheet. The button wads fill the respective holes and are held in place in their corresponding holes by compressive radial frictional engagement with the side walls of each of the holes. Because of this relationship, insertion of the button wads into their respective holes has been a difficult process. The threshold problem was in feeding or threading the leading end of each wad into the respective hole. Further, as each wad is so inserted, insertion resistance increases with increasing insertion depth because the wad-to-hole wall contact area increases with increasing insertion depth. This insertion relationship also made the simple wad-filled hole construction unsuitable for use of long button contacts through substrates having significant thickness, because of the great insertion resistance.

Although the restricted diameter of the holes was deemed necessary to satisfactorily retain the inserted wads, the resulting frictional engagement of the wads with the holes impaired the spring movement of the contacts and hence reduced the effective desirable resiliency of the inserted wads. This was especially true when the holes were formed by etching or drilling, because any roughness or surface discontinuities on the hole walls increased the friction and/or catching of the fine conductors of the contact wads on the walls of the holes. The impairment of spring action movement of the contacts could adversely effect the positioning of the contact ends and cause variances in the compressive engagement of the multiple conductive strand elements making up the contact end surface with an opposed conductive contact surface, with attendant unpredictability of the electrical resistance through the resulting contact interface.

Further, any strand segment or segments of the contact which were misaligned with the respective hole, either because of spreading or "mushrooming" of the protruding contact end or any pulling or other lateral detachment or displacement of a strand segment from the cylindrical contact body became "loose strands" which could be caught between the substrate and the adjacent mating components. This would preclude proper surface-to-surface seating of the component on the substrate and correspondingly limit the compressive force on the main body of the contact and also effect the resultant electrical resistance through the contacts. Such loose strands also can cause short circuits to adjacent conductors on the interconnect substrate or on the respective mating component, such as a circuit board.

The lack of free movement of the contact ends can also cause the buttons to shift off center when compressed in use.

Of course, if the hole diameter is increased to permit a greater degree of resiliency for the buttons, the wad will not be as securely retained in the hole, and the buttons can be easily dislodged during handling and, in some instances, during use.

OBJECTS OF THE INVENTION

Therefore, a primary object of the present invention is to provide improved interconnects using wadded conductor contact elements and which overcome the aforenoted problems.

More specific objects are to reduce insertion resistance for placement of conductor button wads into corresponding holes of an interconnect substrate and to provide consistent predictable spring action movement of the end portions of the wads.

Another object of the invention is to retain each contact wad in its corresponding hole during assembly and shipment.

Still other objects of the invention are to assure reception of all strands of the button wad end within the respective hole in the substrate, and to prevent short circuits between each button and other conductive elements of associated components.

A further object of the invention is to improve the axial centering of the buttons during compression between associated contacts.

A still further object of the invention is to increase the possible insertion length for the wads to allow thick button boards to be fabricated.

The above-described objects, as well as other objects and advantages will be perceived in connection with the description of the preferred embodiment and the appended claims.

SUMMARY OF THE INVENTION

The present invention includes a button board configuration with specially shaped holes through the board, which provides easier insertion of the wadded conductor contact elements. The lower resistance to wad insertion aids in fully seating the wads within their respective holes. It also avoids undue impairment of the resilient movement of the contact portions of the buttons, prevents adverse effects of "loose strands" and minimizes the likelihood of off-center shift. It also allows long contact wads to be fully inserted into holes in very thick button boards. Specifically, the wad receiving holes are configured to have constriction/retention zones of minimum length and enlarged end portions which allow unrestricted movement of the contact end portions of each wad. The end portions of the holes are chamfer-tapered, or chamfer-tapered and countersunk, to facilitate wad insertion as well as lower insertion resistance. Because of the additional wad-to-hole wall clearance provided on each hole end, the button wads retain more effective resilience when compressed by associated surface contacts and their strands are able to expand laterally without overlapping the substrate around their respective holes, thereby preventing interference with abutment positioning of mating components and also prevent unintentional short circuits to adjacent conductive elements.

DESCRIPTION OF THE DRAWINGS

FIGS. 12, 13, 14, 15 and 16 are sectional views of other contact interface assemblies employing teachings of this invention, the latter four illustrating the inclusion of movable plunger-type contact elements associated with the buttons.

DESCRIPTION OF THE PREFERRED EMBODIMENT

Figure 1:
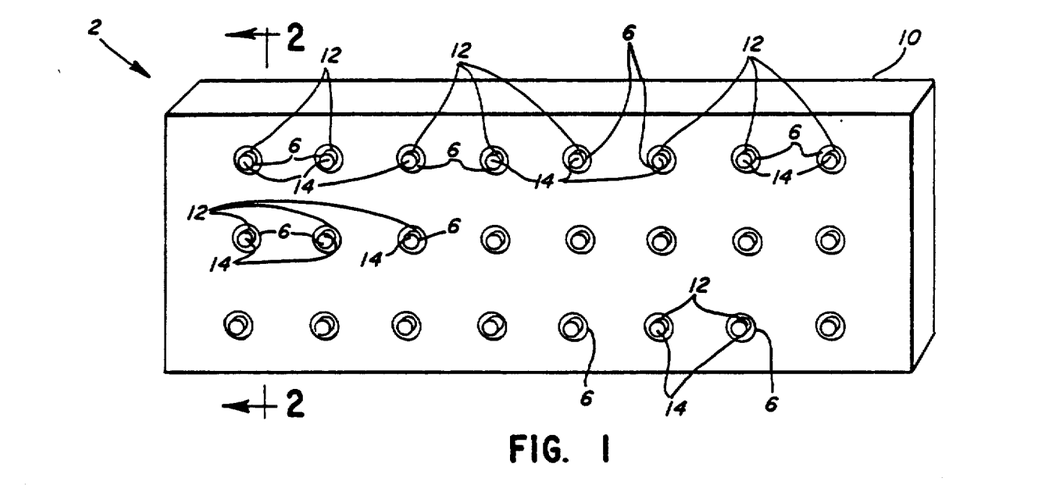
FIG. 1 is an enlarged perspective view of a button board which incorporates the preferred embodiment of the invention.
Figure 2:
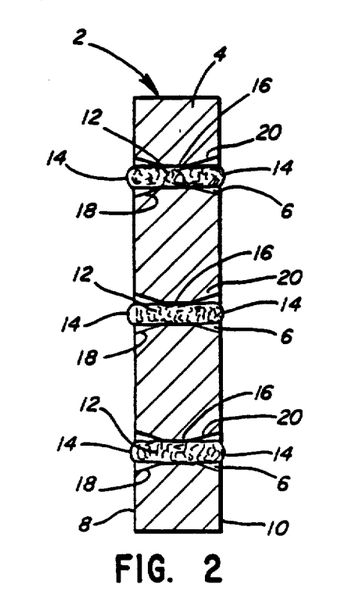
FIG. 2 is a cross-sectional view of the button board along line 2—2 in FIG. 1.
Figure 3:
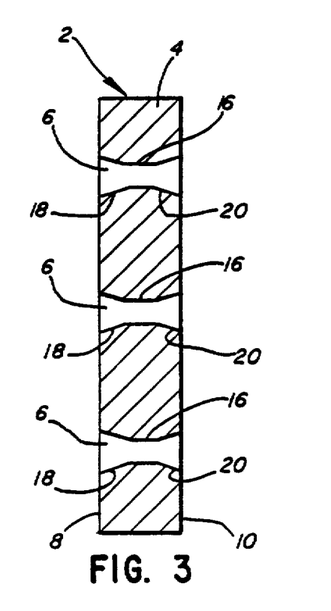
FIGS. 3 is a corresponding view of the board substrate shown in FIG. 2.

Referring to the drawings, wherein like reference characters designate like or corresponding parts throughout the views, FIGS. 1 and 2 show a representational electrical circuit interface assembly in the form of a button board assembly 2 incorporating the present invention. The assembly 2 includes an electrical insulator substrate board or carrier 4, which although shown as generally rectangular, may have any other desired shape, such as cylindrical or tubular. Also, the relative thickness of the carrier and length of the contact wads are exaggerated in these drawings. In most instances the carrier 4 is a thin flat rigid or semi-rigid planar sheet or board and the contact wads are correspondingly short, being of slightly greater relaxed length than the thickness dimension of the carrier 4. Typically, the carrier 4 has a thickness in the range of 0.020 to 0.110 inch.

The carrier 4 includes at least one hole 6 therethrough, but typically there are a plurality of holes 6 arranged about the board in an array, such as a grid pattern, chosen to correspond to the potential locations of circuit interconnection between associated electronic circuit interconnection contacts with which the assembly 2 is to be used. The holes 6 extend from a first surface 8 of the carrier 4 to a second surface 10 of the carrier 4, with the second surface 10 typically being opposite and parallel to the first surface 8.

The hole 6 at each location where an interconnection is desired contains a resilient contact button "wad" 12. Each of the wads 12 comprises a resiliently wadded conductor, typically in the form of an elongated cylindrical contact element comprising a resiliently and randomly wadded single thin gauge electrically conductive wire. By way of example only, the wads 12 may be of the type commercially marketed by Tecknit of Cranford, N.J. under the designation "Fuzz Button" and by AmCon of Hawthorne, Calif. under the designation "Button Contact". The wads 12 extend generally from at least the first surface 8 to the second surface 10, and protrude slightly beyond both the first surface 8 and the second surface 10. The ends of each of the wads 12 exposed at the first surface 8 and the second surface 10 comprise button contacts 14 of the button board assembly 2.

A cross-sectional view of the button board 2 in FIG. 1 along line 2—2, incorporating a preferred embodiment of the present invention, is shown in FIG. 2. Each of the holes 6 has a short central straight cylindrical section 16 intermediate the first surface 8 and the second surface 10. This section 16 is smaller in cross-sectional configuration and/or dimensions than the nominal relaxed cross-section of the wads 12 for compressive frictional engagement of the respective wad to retain the wad 12 in the carrier 4 during handling and, where necessary, during use. The end of the central straight section 16 closest to the first surface 8 joins a first chamfer-tapered section 18 which extends to the first surface 8 with a first included chamfer angle. The other end of the central straight section 16 closest to the second surface 10 joins a second chamfer-tapered section 20 which extends to the second surface 10 and has a second included chamfer angle. The cross sectional configuration and size of the tapered sections preferably are such that the wad 12 is free of engagement with those walls over a substantial portion of its axial length adjacent each end. The outer openings at the surfaces 8 and 10 are substantially larger than the cross-section of the wads 12.

The respective lengths of the central straight section 16, the first tapered section 18 and the second tapered section 20 may be proportioned, as well as the angles of the first and second chamfer angles, depending upon the thickness of the carrier 4, the diameter of the wads 12, the necessary engagement forces for retaining the button wads in the carrier during handling and service, and the desired resiliency of the contacts, as explained in greater detail below.

The carrier 4 preferably is molded or machined with the configuration for the holes 6 as shown in FIG. 2. For example, the carriers 4 may be formed by injection molding of suitable electrically insulating materials. Those materials should have good flow characteristics at molding temperatures to assure formation of the fine detail required for the small hole configurations, particularly when molding thin carriers 4. Core pins of complementary configuration define the holes of the selected configuration in the molds. Specific examples of suitable moldable materials include polyesters, such as the product sold by E. I. DuPont de Nemours & Co. under the tradename Rynite and liquid crystal polymers such as the product marketed by Hoechst Celanese Corporation under the tradename Vectra. Smooth inner wall surfaces of the holes are assured by a molding process, even when glass fiber fillers are included to enhance the stability of the final board product.

The desired hole configuration is also easily secured with a carrier 4 which is suitably machined from a solid sheet or board. The hole 6 is bored completely through the carrier 4 so that it extends from the first surface 8 to the second surface 10 with a diameter corresponding to that desired for the central section 16. The first tapered section 18 is formed in the hole 6 by chamfering the hole 6 to the desired depth and first slope angle from the first surface 8. The second tapered section 20 is formed in the hole 6 by chamfering the hole 6 to the desired depth and second chamfer angle from the second surface 10 thereby completing this configuration for the hole 6 with the first tapered section 18, the second tapered section 20 and the central straight section 16 therebetween. Forming the holes by such machining usually is more economical for short production runs. However, more care is required to secure smooth inner wall surfaces in the holes. Also, use of glass fiber fillers in the substrate preferably is avoided when the holes are to be machined as the imbedded fibers tend to result in rough inner wall surfaces in holes formed by machining. Rough inner walls can catch individual strands of wire which may interfere with the desired resilient operation of the button contacts.

The wad 12 for each of the holes 6 may be inserted through either the first tapered section 18 or the second tapered section 20 and pushed through the hole 6 until it seats as desired, as shown in FIG. 2. The enlarged outer ends and respective tapers of the end sections facilitate the entry of each wad into the respective hole and prevent the individual conductors in the wad 12 from catching on the wall of the hole 6 as the wad 12 is inserted. They also reduce insertion resistance because the wad 12 is only compressively engaged in the hole 6 along the length of the central straight section 16, due to its relatively narrow diameter. Both the lengths and the chamfer angles of the first tapered section 18 and the second tapered section 20 determine the resiliency of their respective button contact end portion, as described in detail below.

Figure 4:
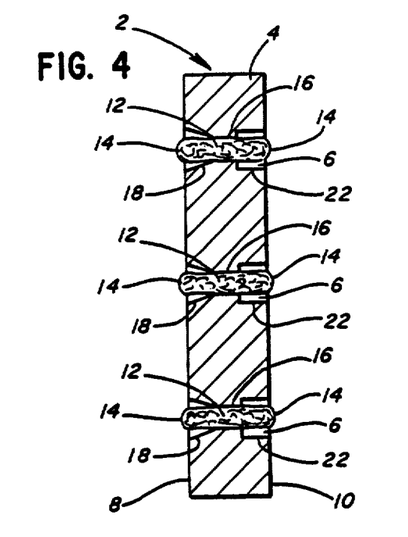
FIG. 4 is a cross-sectional view corresponding to FIG. 2 with an alternate embodiment of the invention.
Figure 5:
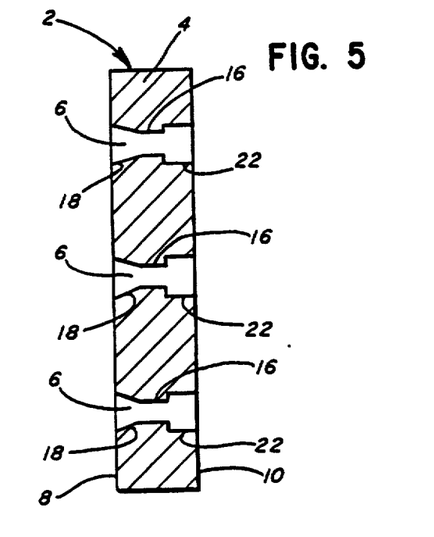
FIGS. 5 is a corresponding view of the board substrate in FIG. 4.

Alternately, another embodiment of the invention is suitable for some applications where the button contacts 14 along the second surface 10 require more wad-to-wall clearance than might otherwise be practical with the first tapered section 18 of the hole 6 described above. FIG. 4 shows a cross-sectional view of the button board 2 corresponding to FIG. 2 with this alternate embodiment configuration for the holes 6. Each of the holes 6 has the central straight section 16 intermediate the first surface 8 and the second surface 10. The end of the central straight section 16 closest to the first surface 8 joins with the first tapered section 18, as described above in connection with the preferred embodiment shown in FIG. 2. However, the other end of the central straight section 16 joins with a second straight section 22 which extends to the second surface 10 and has a uniform counterbore diameter greater than the diameter of the hole 6 represented by the diameter of the central section 16. The respective lengths of the first tapered section 18, the central straight section 16 and the second straight section 22 may be proportioned, as well as the first chamfer angle proportioned and counterbore diameter sized, depending upon the thickness of the carrier 4, the diameter of the wads 12 and the desired resiliency of the button contacts 14, as explained in further detail below. The carrier 4 may be molded with the configuration for the holes 6 as shown in FIG. 4, or machined, as noted above.

Figure 6:
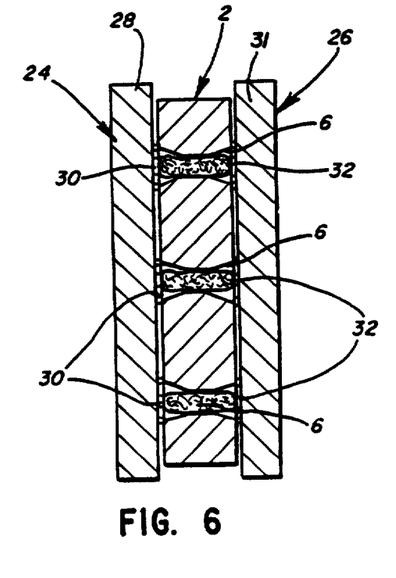
FIG. 6 is a sectional view of an interconnect assembly incorporating the preferred embodiment of the invention coupled to associated circuit boards.

For this embodiment, the wad 12 for each of the holes 6 preferably is inserted into the first tapered section 18 and pushed through the hole 6 until it seats as desired, as shown in FIG. 6. The taper of the first section 18 facilitates entry of the wad 12 into the end opening of the hole and reduces the area in which the individual conductors in the wad 12 can catch on the wall of the hole 6 as the wad 12 is inserted. The first tapered section 18 and the second straight section 22 both reduce insertion resistance because the wad 12 is only compressively engaged in the hole 6 along the length of the central straight section 16, because of its relatively narrow diameter. The lengths of the first tapered section 18 and the second straight section 22 determine the resiliency of their respective button contact end portions, as do the clearance between the ends of the wad 12 with the respective walls of the first tapered section 18 and the second straight section 22, as explained in more detail below.

The operation of the preferred embodiment of FIG. 2 is shown in FIG. 6. The button board 2 is sandwiched between a first circuit board 24 and a second circuit board 26. The first circuit board 24 has an electrically insulated first board barrier 28 carrying electrical circuitry elements with at least one first board surface contact 30, but typically a plurality of the first board surface contacts 30. Each one of the surface contacts 30 is located to coincidentally abut one corresponding button end 14 of a different one of the wads 12 in the button board 2. As shown in FIG. 6, the surface contacts 30 are relatively broad thin flat conductive contact areas or "pads" on the respective exposed surface of the circuit board. The button contacts 14 in abutment contact with the surface contacts 30 are pressed inwardly relative to the surface of the carrier 4 whereby the button is resiliently compressed essentially to the point of co-planar relation with the respective surface 8 or 10 as shown in FIG. 6. No precise alignment of the button and pad is required. The surface contacts 30 have extremely thin contact surfaces, typically in the range of 0.0015 to 0.003 inch thick, and they preferably have a diameter which is in the range of 50 percent larger than the diameter of button contacts 14 so that precise alignment is not required. The surface contacts 30 may be of larger diameter than the surface openings of the holes 6, as shown in FIG. 6, or may be smaller to allow their protrusion into the openings.

The compressive force incident to the resilient compression of the wad 12 provides compressive force engagement of the button contact 14 of the wad 12 and the respective surface contact 30. The wad-to-wall clearance provided by the tapered holes allows the button contacts 14 to be resiliently compressed by the surface contacts 30 with predictable forces and attendant predictable contact pressure and electrical resistance. The improved resiliency also gives the button contacts 14 increased resistance to shifting off-center when compressed. Any shifting of the button contacts 14 or loosened strands, such as may be caused by lateral abrasive movement between the circuit boards and the button board, will remain within the limits of the large open end of the hole and thus will be captured and received therein. This avoids interference of the wad conductor strands with the face-to-face positioning of the board components and permits solid predictable electronic circuit coupling and close button-to-button spacing without the risk of short circuits due to inter-button spill-over from loose conductor ends or off-center shift of the button contacts 14 on the first surface 8 between the button board 2 and the board 24.

Similarly, the second board 26 has an electrically insulated barrier 31 with at least one second board surface contact 32, but typically a plurality of the second board surface contacts 32, each one of the surface contacts 32 arranged to coincidentally couple with the other button contacts 14 of the wads 12 in the button board 2, just as described above in connection with the surface contacts 30 of the first board 24. Thus, the surface contacts 30 of the first board 24 are coupled directly to the corresponding surface contacts 32 on the second board 26 through the respective wads 12 of the button board 2.

It is apparent that the respective lengths of the first tapered section 18, the central straight section 16 and the second tapered section 20 may be adjusted to suit different coupling arrangements and requirements. Furthermore, the first and second chamfer angles for the first tapered section 18 and the second tapered section 20 respectively may also be adjusted for different coupling arrangements and requirements. Finally, the protrusion of the button contacts 14 from the first surface 8 and the second surface 10 is adjustable to suit different operating conditions and requirements.

For example, the first and second included chamfer angles for the first tapered section 18 and the second tapered section 20 respectively have been varied with success from approximately 15 degrees when used with the button board carrier 4 having a total thickness of in the range of 0.100 inch, and with a wad 12 length in the range of 0.125 inch from one of the button contacts 14 to the other, to much greater chamfer angles, in the range of 60 degrees, with a carrier 4 thickness of approximately 0.030 inch and a wad 12 length in the range of 0.050 inch between its respective button contacts 14, with wad 12 diameters in the range of 0.040 inch.

Figure 7:
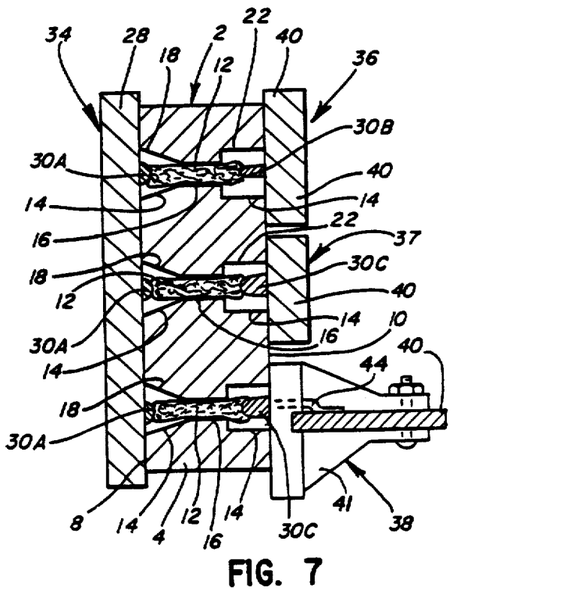
FIG. 7 is a sectional view of an interconnect assembly incorporating the alternate embodiment of the invention coupled to associated circuit boards with modified forms of contact interfaces.

The operation of an alternate embodiment is shown in FIG. 7. Here, the button board 2 is sandwiched between the first circuit board 34 and third circuit connectors 36 and 38. The coupling of the first circuit board 34 with the button board 2 is generally as described above for the preferred embodiment in connection with FIG. 6 except that the contacts 30A are of configurations and dimensions to protrude into the openings and partially nest in the ends of the button wads 12. The enlarged portions of the holes accommodate any related expansion of the wad and also allow lateral movement of the engaged board.

Each of the third circuit connectors 36, 37 and 38 has an electrically insulative third substrate or circuit board 40 with at least one slim, pin-like, rigid, conductive contact 30B, 30C protruding outwardly for penetration into the subjacent end portion of a wad 12. The resilience of the internal random spring mesh structure of the button wads 12 as well as the freedom for limited lateral movement of the button contact 14 of each wad 12 in its hole allows for lateral movement of the connectors 36, 37 and 38 after the connector is seated on the carrier 4 with its contact 30B, 30C in the respective wad 12. Such lateral movement may be useful, for example, in moving a component on which the connector is mounted laterally into engagement with another component, such as a heat sink, after the component is seated on the carrier 4. Thus, lateral surface-to-surface contact may be established between components for operational purposes while avoiding such contact during the insertion movement. In the connector 38, the circuit board 40 is mounted normal to the board 4 in a holder body 41, and a conductor 44 connects the board circuit to the contact 30C.

Figure 8:
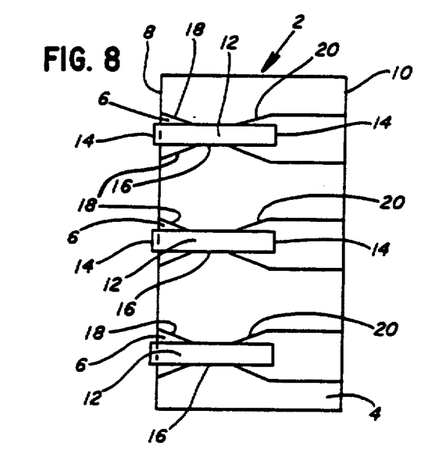
FIG. 8 is a button board incorporating the invention with recessed buttons along one contact surface.
Figure 9:
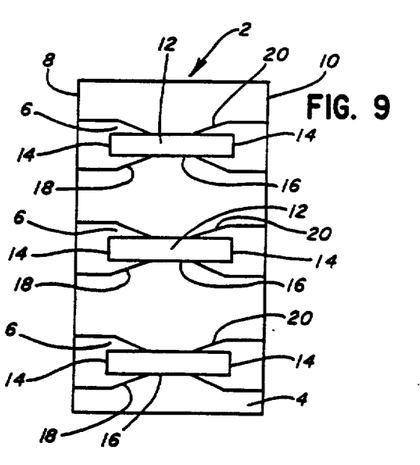
FIG. 9 is a button board incorporating the invention with recessed buttons along both contact surfaces.

Of course, the button contacts 14 need not protrude from each side of the button board 2 as shown in the examples described above. The button board may have the buttons contacts 14 recessed along the first surface 8, or both the first surface 8 and the second surface 10, for applications including circuit contacts with long pins or slugs, for example, as shown in FIGS. 8 and 9, respectively. Also, in some uses, only one end of their contacts need be exposed for engagement by another circuit component.

Figure 10:
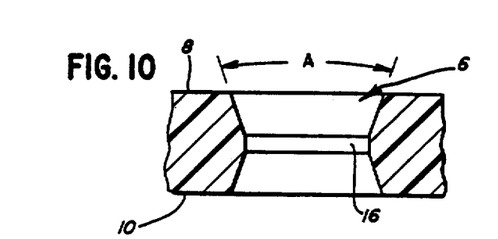
FIGS. 10 and 11 are further enlarged sectional views of board substrate section illustrating in greater detail examples of suitable cavity or hole configurations.
Figure 11:
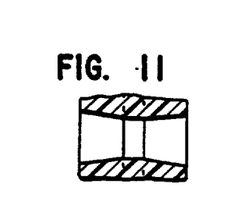

FIGS. 10 and 11 illustrate two specific configurations of holes 6 which have been found satisfactory in practical applications. Referring first to FIG. 10, the carrier 4 is nominally 0.032 inch thick. The centered cylindrical neck portion 16 of the hole 6 is 0.0385 inch in diameter and 0.006 inch in axial length, and each of the end portions is about 0.013 inch long, measured axially, and of a truncated conical configuration coaxial with the centerline of hole 6 and having sides tapering outwardly from the center portion at an included chamfer angle A of 38 degrees. This configuration is satisfactory for retention and operation of cylindrical button wads 12 formed of a randomly bent fine wire and having a relaxed (nonstressed) outside diameter of 0.040 inch and a length in the range of 0.055 to 0.060 inch. The carrier 4 of FIG. 11 is nominally 0.100 inch thick. The centered cylindrical neck portion 16 is 0.016 inch long and 0.0385 inch in diameter, with the end portions 18 and 20 each about 0.042 inch long and tapering outward from the center portion at an included chamber angle of 15 degrees, to receive cylindrical button wads 12 also formed of fine wire and having an outside diameter of 0.040 inch and length in the range of 0.125 to 0.140 inch. Of course, many other configurations may be suitable for specific applications. In general, for wad 12 diameters D is in the range of 0.020 to 0.060 inch, the diameter of the cylindrical neck portion 16 can be expressed as D—0.0025 inch.

Figure 12:
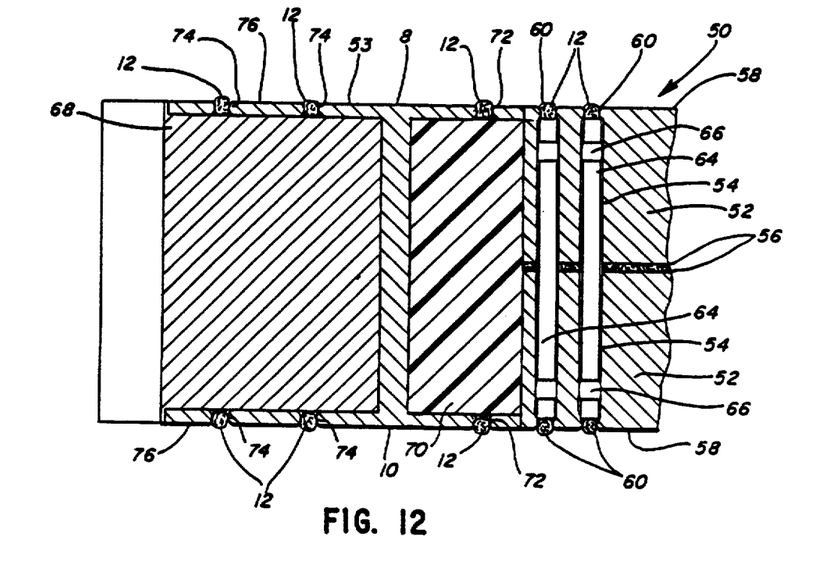

FIG. 12 is a cross-section of a spacing connector 50 of substantial thickness for interconnecting components such as two circuit boards where adequate clearance must be provided between those boards for mounting of other components on one or both of the opposed faces of the circuit boards. The illustrated connector is of relatively narrow width (normal to the plane of FIG. 12) and is of appropriate plan configuration, or two or more such connectors are used in spaced relation to one another, to accommodate such other components in open space between the circuit boards which will abut opposite surfaces 8 and 10.

The assembly 50 illustrates a number of instances of use of shaped cavities for the button wads 12, employing teachings of this invention. Here the basic construction of the connector is two thick connector halves 52, which are mirror images of one another, except that one includes an integral end body structure at 53. Each body half 52 is formed with elongated openings 54 extending from the inner surface 56 to the outer surface 58. Each of those openings comprises a double chamfered outer portion 60 similar to the holes shown in FIG. 10, for receiving and retaining a cylindrical wire button wad 12, and an inner cylindrical portion extending from the inner end of the portion 60 to the respective inner surface 56. The body halves 52 may include adhesive for assisting in holding the assembled halves together if desired. An elongated conductive slug 64 is provided for each aligned pair of openings 54 as illustrated. Each of the slugs 64 includes an enlarged spacing and gripping band portion 66 adjacent each end for desirably positioning the slug centrally of the respective hole 54. These band portions or other protuberances may have press-fit engagement with the walls of the holes 54 as means for securing the components together.

In the course of assembly of the connector 50, a wad 12 is placed in each selected hole 54 of one of the body halves 52 and the slugs 64 are then inserted in those holes 54 thereby forcing the wad 12 into the respective end hole portions 60, with the outer button contact 14 protruding outwardly of the respective surface 58, and establishing firm conductive contact between the inner button contact 14 of that wad 12 and the respective end of the slug 64. The slugs 64 are of larger diameter than the diameter of the inner section of each hole portion 60, which limits and controls the positioning of the slugs 64 and the wads 12. The wads 12 then are placed in the holes 54 of the other body half 52 and that body half 12 is pressed onto the extending ends of the slugs 64 to similarly force those wads 12 into their respective end portions 60, with protruding outer button contacts 14, and establish conductive contact with the second ends of the slugs 64 as illustrated. It will be appreciated that a spacer button board connector assembly thereby is provided for effecting direct interconnection between circuits of components at the opposite outer surfaces 58.

The connector 50 also includes a ground plane plate 68 and a power plate as at 70. Correspondingly shaped holes 72 and 74 are provided through opposite portions 76 of the insulating body of connector 50 which receive wads 12 for contacting the ground plane and power plate presenting exposed outer button contacts 14 for contact engagement with suitable connective elements of the components associated with the connector 50.

Figure 13:
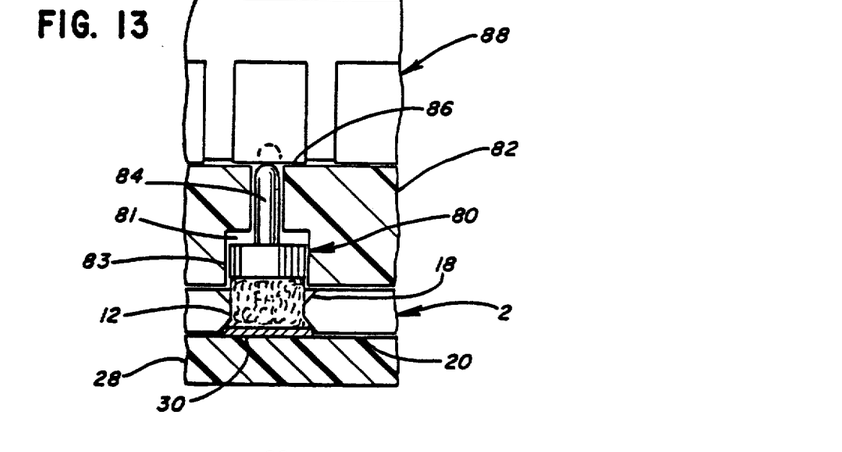
Figure 14:
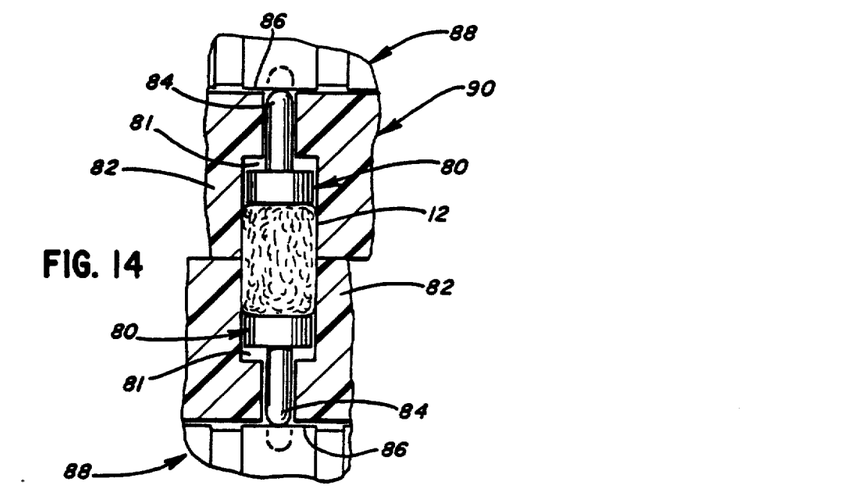
Figure 15:
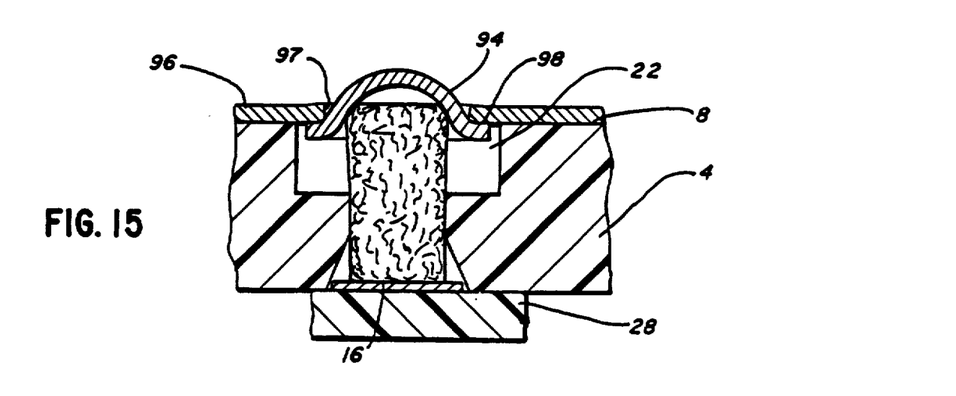

In the assemblies illustrated in FIGS. 13, 14 and 15, a movable plunger-type contact element engages one contact 14 of the respective wad 12 in a manner to obtain resilient movement of that plunger axially of the button wad 12, by virtue of the resilience of that wad 12. FIGS. 13 and 14 illustrates such use, for example, in a microchip tester. In FIG. 13, a T-shaped contact plunger 80 is mounted in an opening 81 of complementary configuration in an insulative plunger board 82. The plunger 80 includes an enlarged circular base portion 83 received within a counterbore portion of hole 81 and a contact stem 84 extending through an aperture of reduced diameter from the counterbore portion to the opposite surface. The outer end of stem portion 84 is intended to conductively contact an appropriate contacting portion of a circuit element of an opposed component, such as the contact pad 86 on, and which is connected to the circuitry of a microchip holder 88. A button board 2 includes wads 12 having one button contact 14 projecting upwardly into the counterbore portion of recess 81 for resilient compressive engagement with the lower surface of the plunger 80. The opposite button contact 14 of the wad 12 is in conductive engagement with a surface contact 30 of a circuit board 28.

In this construction, chamfered portions are provided at each end of the holes through which the wads 12 may project, as illustrated at 18 and 20. In this arrangement, the compressive resilience of the wad 12 is relied upon for positioning of the contact plunger 20. The interposition of such a plunger arrangement may be advantageous where the use involves a high number of cycles of contacting and removal of the contact components associated with one end of the button, which might involve high wear and degradation of the respective end surface portion of the button.

FIG. 14 shows a double-sided plunger board assembly 90 which uses two of the insulated plunger boards 82 mounted back-to-back. Each of the plunger boards 82 has at least one of the openings 81, and the openings 81 on each of the plunger boards 82 are axially aligned with each other. Each of the openings 81 in each of the plunger boards 82 have respective plungers 80 mounted within them to extend their contact stems 84 beyond the outer surfaces of the plunger boards 82. A wad 12 mounted between each respective pair of the plungers 80 in the openings 81 compressively extends the plungers 80 away from each other, thereby forcing their respective stems 84 to fully extend from the outer surfaces of the plunger boards 82. In this case, the wad 12 floats freely within the openings 81 of the plunger boards 82. The double-sided plunger board assembly 90 allows the contact pads 86 of the two different holders 88 to be coupled. The pads 86 compressively engage respective contact stems 84 of the plungers 80 due to the resilience of the wad 12.

In the embodiment of FIG. 15, the wad 12 is mounted in a hole 6 extending through the carrier 4, as shown in FIG. 4, with its lower button contact 14 exposed for engagement with an appropriate contact component as in the other embodiments. Its upper button contact 14 extends through a large counterbore opening 22 which also accommodates a dome-shaped plunger contact element 94 engaged over the upper button contact 14 of the wad 12. The element 94 has reciprocal movement within the enlarged upper end 22 of the hole 6. An insulating retainer sheet 96, with openings 97 therein smaller than the outside diameter of flanges 98 on the plunger 94, is bonded to the upper surface 8 of the carrier 4 and overlaps the flanges 98 of the plunger contact 94 to capture the contact and retain it in position on the wad 12 for its reciprocal movement, as described. Again, the enlarged portions of the hole 6, including the chamfered section 18 and the counterbore section 22 provide freedom of compressive movement of the respective button contacts 14 of the wad 12 and the other advantages noted above in respect to the advantageous configurations of this invention.

It will be appreciated that many other configurations, uses and applications of this invention will occur to those skilled in the art, particularly in view of the teachings of this invention.

Thus, there has been described herein methods and apparatus for improving button boards with a button board configuration having specially configured cavities to provide ease of assembly, preserve resilient movement of the buttons over their full intended operational range, provide better button centering, avoid short-circuiting, and also allow construction of thick button boards with wads of suitable length.

It will be understood that various changes in the details, arrangements and configurations of the parts and assemblies which have been described and illustrated herein in order to explain the nature of the invention may be made by those skilled in the art within the principle and scope of the present invention as expressed in the appended claims.

What is claimed is:

1. An electrical contact interface member of the type which includes a resilient wadded conductor contact element disposed in a cavity within an electrically non-conductive carrier component and which cavity has one end thereof open through one surface of said carrier component, with the end surface of one end portion of said wadded contact element exposed through said cavity opening, wherein said cavity is defined by wall portions of said component and comprises an inward first portion which includes means for engaging said wadded wire contact element and retaining said element in said carrier component and a second portion which extends inward through said surface toward said first portion and receives therein said end portion of said element, said second portion of said cavity being of a cross-sectional configuration and dimensions at least as large as the nominal relaxed cross sectional configuration and dimensions of said end portion of said contact element disposed therewith to allow free movement of said end portion of said element generally normal to said one surface within said second portion of said cavity, whererby said end portion of said element is free for compressive movement within said second portion of said cavity generally normal to said one surface.

2. The invention as in claim 1 wherein said second portion of said cavity has cross-sectional dimensions greater than said nominal relaxed cross-sectional dimensions of said end portion of said contact element.

3. The invention as in claim 1 wherein said means for engaging and retaining said contact element comprises an inner portion of said cavity being of cross-sectional configuration and dimensions less than the nominal relaxed dimensions of a corresponding portion of said contact element, said corresponding portion of said contact element being frictionally engaged by the wall portions of said component defining said inner portion.

4. The invention as in claim 1 wherein said end portion of said element projects outward from said recess, beyond said surface of said component, when said element is in an uncompressed state, and said element being compressible into said cavity under normal conditions of compressive engagement therewith by an electrically conductive surface element of a complementary component.

5. The invention as in claim 1 wherein said wadded conductor is a wadded fine conductor wire.

6. The invention as in claim 1 and wherein said non-conductive carrier component having said cavities therein is a product formed by molding.

7. The invention as in claim 1 wherein said second portion of said cavity has cross-sectional dimensions at said surface which are substantially greater than said nominal relaxed cross-sectional dimensions of said end portion of said element.

8. The invention as in claim 7, wherein said second portion is of a right circular cylindrical configuration.

9. The invention as in claim 7, wherein said second portion is of a tapered configuration which progressively diminishes in cross-section inwardly from said surface.

10. The invention as in claim 9, wherein the walls of said second portion are tapered at an angle in the range of 15 to 60 degrees relative to the central axis of said cavity.

11. The invention as in claim 1, 2, 7, 9, 10, 3 or 4, wherein said carrier component has two substantially parallel surfaces, said cavity extending through said carrier component and including said first portion intermediate said surfaces and a said second portion communicating with each of said surfaces and said contact element extends through said first portion and into each of said second portions.

12. The invention as in claim 11, wherein said contact element is of a substantially uniform cylindrical configuration throughout its length and of a nominal relaxed diameter greater than the diameter of said first portion of said cavity, whereby said contact is retained in said barrier component by frictional engagement with the wall portions thereof defining said inner portion and the portions of said contact in said second portions of said cavity being free of restriction by the wall portions of said carrier component which define said second portions.

13. The invention as in claim 11, wherein said carrier component is formed with a plurality of said cavities distributed in a predetermined array therein and a plurality of said resilient wadded conductor contacts are so disposed in selected ones of said cavities.

14. The invention as in claim 13, and wherein said non-conductive carrier component having said cavities therein is a product formed by molding.

15. A method of interconnecting electronic surface contacts through an electrically insulated circuit interface carrier having a first surface and a second surface opposite said first surface, comprising the steps of:
    forming at least one hole having a hole diameter through said carrier from said first surface to said second surface;
    forming each of said holes with a chamfer adjacent said first surface of said carrier to form a first chamfer-tapered section with a first chamfer angle for each of said holes;
    forming each of said holes with an enlargement adjacent said second surface of said carrier to form a second section having a greater intra-wall separation than said hole diameter for each of said holes;
    forming wadded electric current conductor contacts for selected ones of said holes with a wad diameter larger than said hole diameter; and
    inserting one of said wadded conductor contacts through each selected one of said holes to arrange each of said conductor contacts to extend from said first chamfer-tapered section into said second section in each of said holes.

16. The invention recited in claim 15, wherein said step of inserting comprises the step of arranging the extension of said conductor contacts to protrude from said first surface and said second surface of said carrier.

17. The invention recited in claim 15, wherein said step of forming said wadded conductor contacts comprises the step of randomly wadding fine diameter wire.

18. The invention recited in claim 15, further comprising the step of forming said carrier by molding wherein said holes, including said chamfered first sections and said enlarged second sections, are formed in the molding step.

19. A method of interconnecting electronic surface contacts through an electrically insulated circuit interface carrier having a first surface and a second surface opposite said first surface, comprising the steps of:
  boring at least one hole having a hole diameter through said carrier from said first surface to said second surface;
  chamfering each of said bored holes from said first surface of said carrier to form a first chamfer-tapered section with a first chamfer angle for each of said bored holes;
  chamfering each of said bored holes from said second surface of said carrier to form a second chamfer-tapered section with a second chamfer angle for each of said bored holes;
  wadding electric current conductors to form conductor wads for selected ones of said holes with a wad diameter larger than said hole diameter; and
  inserting each one of said conductor wads through each different one of said selected holes to arrange each of said conductor wads to substantially extend from said first chamfer-tapered section to said second chamfer-tapered section in each of said holes.

20. The method recited in claim 19, wherein said step of inserting comprises the step of arranging the extension of said conductor wads to protrude from said first surface and said second surface of said carrier.

21. The method recited in claim 19, wherein said step of inserting comprises the step of arranging the extension of said conductor wads to substantially extend from said first surface to said second surface of said carrier.

22. The method recited in claim 19, wherein said step of inserting comprises the step of arranging the extension of said conductor wads to be recessed from said first surface and said second surface of said carrier.

23. The method recited in claim 19, wherein said step of wadding comprises randomly wadding fine diameter wire.

24. The method recited in claim 19, wherein said step of chamfering each said hole from said first surface comprises chamfering said first chamfer-tapered section with said first chamfer angle in the range of 15 to 60 degrees.

25. The method recited in claim 19, wherein said step of chamfering each said hole from said second surface comprises chamfering said first chamfer-tapered section with said first chamfer angle in the range of 15 to 60 degrees.

26. The method recited in claim 19, wherein said step of chamfering each said hole from said second surface comprises chamfering said second chamfer-tapered section with said second chamfer angle substantially the same as said first chamfer angle.

27. A method of interconnecting electronic surface contacts through an electrically insulated circuit interface carrier having a first surface and a second surface opposite said first surface, comprising the steps of:
  boring at least one hole having a hole diameter through said carrier from said first surface to said second surface;
  chamfering each of said bored holes from said first surface of said carrier to form a first chamfer-tapered section with a first chamfer for each of said bored holes;
  counterboring each of said bored holes with a counterbore diameter larger than said hole diameter from said second surface of said carrier to form a counterbored section with a counterbore depth for each of said bored holes;
  wadding electric current conductors to form conductor wads for selected ones of said holes with a wad diameter larger than said hold diameter; and
  inserting each one of said conductor wads through each different one of said selected holes to arrange each of said conductor wads to substantially extend from said chamfer-tapered section to said counterbored section in each of said holes.

28. The method recited in claim 27, wherein said step of inserting comprises the step of the extension of said conductor wads to protrude from said first surface and said second surface of said carrier.

29. The method recited in claim 27, wherein said step of inserting comprises the step of arranging the extension of said conductor wads to substantially extend from said first surface to said second surface of said carrier.

30. The method recited in claim 27, wherein said step of inserting comprises the step of arranging the extension of said conductor wads to be recessed from said first surface and said second surface of said carrier.

31. The method recited in claim 27, wherein said step of wadding comprises the step of randomly wadding fine diameter wire.

32. The method recited in claim 27, wherein said step of chamfering each said hole from said first surface comprises chamfering said chamfer-tapered section with said chamfer angle in the range of 15 to 60 degrees.

33. An electrically insulated circuit interface carrier including electronic circuit connectors for providing interconnecting surface contacts through said carrier from a first carrier surface to a second carrier surface opposite said first carrier surface, comprising:
  at least one hole passing through said carrier from said first surface to said second surface, each of said holes including a central hole section having a central section diameter, a first chamfer-tapered section from said first surface to said central section with a first chamfer angle, and a second enlarged section from said second surface to said central section with an intra-wall separation greater than said central section; and
  at least one electric current conductor wad, a different one of said conductor wads mounted in each different one of said holes by compressive engagement of said central section with each of said conductor wads extending substantially from said first section to said second section in each of said holes.

34. The interface carrier recited in claim 33, wherein said second section comprises a chamfer-tapered section with a second chamfer angle.

35. The interface carrier recited in claim 34, wherein each of said conductor wads protrude from said first surface and said second surface of said carrier.

36. The interface carrier recited in claim 34, wherein each of said conductor wads substantially extend from said first surface to said second surface of said carrier.

37. The interface carrier recited in claim 34, wherein each of said conductor wads are recessed from said first surface of said carrier.

38. The interface carrier recited in claim 34, wherein said conductor wads comprise randomly wadded fine diameter wire.

39. The interface carrier recited in claim 34, wherein said first chamfer-tapered section has said first chamfer angle in the range of 15 to 60 degrees.

40. The interface carrier recited in claim 34, wherein said second chamfer-tapered section has said second chamfer angle is the range of 15 to 60 degrees.

41. The interface carrier recited in claim 34, wherein said second chamfer angle is substantially the same as said first chamfer angle.

42. The interface carrier recited in claim 33, wherein said first surface and said second surface have a separation in the range of 0.030 to 0.100 inch.

43. The interface carrier recited in claim 33, wherein said conductor wad diameter is in the range of 0.020 to 0.040 inch.

44. The interface carrier recited in claim 33, wherein said second section comprises a counterbored section with a counterbore diameter and a counterbore depth.

45. The interface carrier recited in claim 44, wherein each of said conductor wads protrude from said first surface and said second surface of said carrier.

46. The interface carrier recited in claim 44, wherein each of said conductor wads substantially extend from said first surface to said second surface of said carrier.

47. The interface carrier recited in claim 44, wherein each of said conductor wads are recessed from said first surface of said carrier.

48. The interface carrier recited in claim 44, wherein said conductor wads comprise randomly wadded fine diameter wire.

49. The interface carrier recited in claim 44, wherein said chamfer-tapered section has said chamfer angle in the range of 15 to 60 degrees.

50. The interface carrier recited in claim 44, wherein said first surface and said second surface have a separation in the range of 0.030 to 0.100 inch.

51. The apparatus recited in claim 44, wherein said conductor wad diameter is in the range of 0.020 to 0.040 inch.

* * * * *

UNITED STATES PATENT AND TRADEMARK OFFICE
CERTIFICATE OF CORRECTION

PATENT NO. : 4,988,306

DATED : January 29, 1991

INVENTOR(S) : ALBERT N. HOPFER, III and RICHARD J. LINDEMAN

It is certified that error appears in the above-identified patent and that said Letters Patent is hereby corrected as shown below:

Col. 3, line 32, "FIGS." should be -- FIG. --.

Col. 3, line 36, "FIGS." should be -- FIG. --.

Col 11, line 41, "whererby" should be -- whereby --.

Col. 14, line 15, "hold" should be -- hole --.

Col. 15, line 14, "is" should be -- in --.

Signed and Sealed this

Fourth Day of May, 1993

Attest:

MICHAEL K. KIRK

*Attesting Officer*        *Acting Commissioner of Patents and Trademarks*

UNITED STATES PATENT AND TRADEMARK OFFICE
CERTIFICATE OF CORRECTION

PATENT NO. : 4,988,306

DATED : January 29, 1991

INVENTOR(S) : ALBERT N. HOPFER, III and RICHARD J. LINDEMAN

It is certified that error appears in the above-indentified patent and that said Letters Patent is hereby corrected as shown below:

In Col. 3, line 52, "FIGS. 12, 13, 14, 15 and 16 are sectional views of " should read -- FIGS. 12, 13, 14 and 15 are sectonal views of --

Signed and Sealed this

Twenty-sixth Day of September, 1995

Attest:

BRUCE LEHMAN

*Attesting Officer*   *Commissioner of Patents and Trademarks*